(12) United States Patent
Rivaud et al.

(10) Patent No.: US 10,736,227 B1
(45) Date of Patent: Aug. 4, 2020

(54) STACKABLE TELECOMMUNICATIONS EQUIPMENT POWER DISTRIBUTION ASSEMBLY AND METHOD

(71) Applicant: Ciena Corporation, Hanover, MD (US)

(72) Inventors: Daniel Rivaud, Ottawa (CA); Andrew L. Jarabek, Nepean (CA); Anthony Mayenburg, Carp (CA); Fabien Colton, Kars (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/409,972

(22) Filed: May 13, 2019

(51) Int. Cl.
*H01R 25/16* (2006.01)
*H05K 7/02* (2006.01)
*H05K 7/18* (2006.01)

(52) U.S. Cl.
CPC ............. *H05K 7/026* (2013.01); *H01R 25/16* (2013.01); *H01R 25/162* (2013.01); *H05K 7/023* (2013.01); *H05K 7/186* (2013.01)

(58) Field of Classification Search
CPC .... H01R 25/16; H01R 25/161; H01R 25/162; H05K 7/023; H05K 7/026; H05K 7/186; H05K 2201/10363; H02B 1/202
See application file for complete search history.

(56) References Cited

U.S. PATENT DOCUMENTS

| | | | | |
|---|---|---|---|---|
| 4,688,869 | A * | 8/1987 | Kelly | H01R 25/14 439/121 |
| 5,448,015 | A * | 9/1995 | Jamet | G02B 6/444 174/101 |
| 6,948,968 | B1 | 9/2005 | Shearman et al. | |
| 8,154,867 | B2 | 4/2012 | Shearman et al. | |
| 9,086,447 | B1 * | 7/2015 | Ledbetter, III | G01R 31/3274 |
| 9,603,289 | B1 | 3/2017 | Shearman et al. | |
| 9,769,959 | B2 | 9/2017 | Mayenburg et al. | |
| 9,820,403 | B2 | 11/2017 | Shearman et al. | |
| 10,012,811 | B2 | 7/2018 | Rivaud et al. | |
| 10,247,895 | B2 | 4/2019 | Rivaud et al. | |
| 2002/0126457 | A1 * | 9/2002 | Kameyama | H01R 13/6658 361/728 |
| 2003/0207612 | A1 * | 11/2003 | McCoy | H01R 13/60 439/533 |
| 2004/0000815 | A1 * | 1/2004 | Pereira | G06F 1/189 307/11 |

(Continued)

*Primary Examiner* — Jacob R Crum
(74) *Attorney, Agent, or Firm* — Clements Bernard Walker; Christopher L. Bernard; Lawrence A. Baratta, Jr.

(57) ABSTRACT

The solution of the present disclosure connects the power in parallel distribution chains. A horizontal pizza box in the middle of the equipment stack represents the power box (PB), which houses the power modules (PMs), such as the power input modules (PIMs) or the power supply units (PSUs). The PMs in the PB are connected to the office power source(s), and the PB supplies power to the parallel distribution chains (A' and B'). The parallel distribution chains are composed of jumper segments that are based on busbar-like technology, with each jumper segment being the length of the distance between coupled boxes. Any box can be removed without disrupting either distribution chain. Advantageously, the jumper segments are touch-proof, from a safety perspective. Thus, instead of a jumper created using a cable, PCB, etc., or a jumper composed of a custom molded back-to-back connector, the jumpers are based on busbar-like technology.

20 Claims, 4 Drawing Sheets

(56) References Cited

U.S. PATENT DOCUMENTS

| | | | |
|---|---|---|---|
| 2004/0190241 A1* | 9/2004 | Cyphers | H05K 7/1457 361/829 |
| 2005/0124180 A1* | 6/2005 | Simonovich | H01R 12/7005 439/64 |
| 2005/0265013 A1* | 12/2005 | Keith | H04Q 1/142 361/826 |
| 2008/0002937 A1* | 1/2008 | Spisany | H01R 9/2408 385/135 |
| 2010/0055971 A1* | 3/2010 | Craig | H05K 7/186 439/488 |
| 2010/0328852 A1* | 12/2010 | Johnson | H01R 25/16 361/641 |
| 2011/0051341 A1* | 3/2011 | Baldassano | H05K 7/186 361/679.02 |
| 2014/0016903 A1* | 1/2014 | Coffey | G02B 6/444 385/100 |
| 2014/0160686 A1* | 6/2014 | Benson | H02M 7/003 361/724 |
| 2015/0234440 A1* | 8/2015 | Gardner | H05K 7/1492 713/300 |
| 2017/0126589 A1 | 5/2017 | Estabrooks et al. | |
| 2017/0127553 A1* | 5/2017 | White | G06F 11/0745 |
| 2017/0207607 A1* | 7/2017 | Lee | H02B 1/308 |
| 2017/0257970 A1* | 9/2017 | Alleman | G06F 1/184 |
| 2018/0284377 A1* | 10/2018 | Chiron | G02B 6/4471 |
| 2018/0294982 A1* | 10/2018 | Boemi | H01R 25/006 |
| 2019/0124422 A1* | 4/2019 | Diaz | H04Q 1/023 |

* cited by examiner

STACKABLE TELECOMMUNICATIONS EQUIPMENT POWER DISTRIBUTION ASSEMBLY AND METHOD

TECHNICAL FIELD

The present disclosure relates generally to the telecommunications and optical networking fields. More specifically, the present disclosure relates to a stackable telecommunications equipment power distribution assembly and method.

BACKGROUND ART

Conventional telecommunications equipment design focuses on chassis-based or standalone pizza box-based systems. In such systems, stackable pizza boxes are interconnected with copper cabling or the like for data signaling and control between the individually replaceable modules. As no backplane is thus utilized, power distribution presents significant challenges.

In general, a compact cabling and connector solution is required that leaves space for data signaling and control connectors, as well as associated airflow space and space for removable fans and the like. It is important that reliability and redundancy comparable to that of a backplane is provided, and cable and connector handling and voltage concerns must be addressed. During installation and maintenance, arcing at the power input connectors must be avoided. It is also important to provide an expandable system that does not require the pre-allocation of power distribution ports and rack space. Further, a variety of module heights must be accommodated (e.g., 1 RU, 1.5 RU, 2 RU, 3 RU, and 4 RU) in one stack, without the need for complex cable slack management and storage systems that could result in a mess of wiring. Still further, one solution should address user-specific needs by offering a variety of flexible and upgradable powering options, such as 1:1 (AB) redundancy, N+1 redundancy, and AC/DC power options, as well as accomodating different office feed voltages and amperage ratings, as well as other needs. Finally, spacing tolerances between modules and the considerations associated with EIA rack units and ETSI 25 mm vertical spacing requirements must be accommodated.

Point-to-point cabling addresses some, but not all, of these issues. Thus, more robust power distribution interfaces between individually replaceable modules are required.

SUMMARY

The solution of the present disclosure connects the power in parallel distribution chains. A horizontal pizza box co-located in the equipment stack represents the power box (PB), which houses the power modules (PMs), such as the power input modules (PIMs) or the power supply units (PSUs). The PMs in the PB are connected to the office power source(s), and the PB supplies power to the parallel distribution chains (A' and B'). To allow the equipment stack to grow both above and below the power box, it can be vertically located near the center of the equipment rack.

The parallel distribution chains are composed of rigid but compliant jumper segments that are loosely based on busbar-like technology, with each jumper segment being the length of the distance between coupled boxes, typically 1 RU, but potentially also longer. Any box can be removed without disrupting either distribution chain. Advantageously, the jumper segments are touch-proof, from a safety perspective. Thus, instead of a jumper created using a cable, PCB, or the like, or a jumper composed of a custom molded back-to-back connector, the jumpers are loosely based on busbar-like technology, including a rigid but compliant conductive material that is insulated for safety. The jumper assembly and its connectors include(s) separate conductors for direct current (DC) and the return. The jumpers may also include additional conductors for low-level communications between the coupled equipment.

In one exemplary embodiment, the present disclosure provides a stackable telecommunications equipment power distribution assembly, including: a rack structure; a power box including one more power modules disposed in the rack structure; one more functional boxes disposed in the rack structure adjacent to the power box; and one or more power distribution connectors adapted to couple and distribute power between one or more of (a) the power box and an adjacent one of the one or more functional boxes and (b) adjacent functional boxes of the one or more functional boxes; wherein each of the one or more power distribution connectors includes a rigid but compliant power jumper segment including a first connector disposed at each end thereof adapted to engage the associated power box or functional box. The power jumper segment further includes one or more second connectors disposed at one or more ends thereof adapted to engage a first connector of another power jumper segment to form a linked chain of power jumper segments. The power jumper segment is formed with a bend along a length thereof, creating a spring section that permits the length of the power jumper segment to be adjusted to a degree via compression or extension thereof. Each of the one or more power distribution connectors further includes a connection detection mechanism adapted to detect the coupling of the first connector with or the disconnection of the first connector from the associated power box or functional box. The connection detection mechanism is further adapted to power up or power down the power box or functional box upon detecting the coupling of the first connector with or the disconnection of the first connector from the power box or functional box. The power distribution assembly further includes a modulation mechanism adapted to apply a modulation scheme to power distributed over the one or more power distribution connectors, thereby providing a communications channel between the power box and the one or more functional boxes. The one or more power distribution connectors are coupled together to form a primary and/or secondary power distribution chain between the power box and the one or more functional boxes.

In another exemplary embodiment, the present disclosure provides a stackable telecommunications equipment power distribution connector, including: a rigid but compliant power jumper segment; a first connector disposed at each end of the power jumper segment adapted to engage the associated power box or functional box; and one or more second connectors disposed at one or more ends of the power jumper segment adapted to engage a first connector of another power jumper segment to form a linked chain of power jumper segments. The power jumper segment is formed with a bend along a length thereof, creating a spring section that permits the length of the power jumper segment to be adjusted to a degree via compression or extension thereof. The power distribution connector further includes a connection detection mechanism adapted to detect the coupling of the first connector with or the disconnection of the first connector from the associated power box or functional box. The connection detection mechanism is further adapted to power up or power down the power box or functional box upon detecting the coupling of the first connector with or the disconnection of the first connector from the power box or functional box. The power distribution connector further includes a modulation mechanism adapted to apply a modulation scheme to power distributed over the one or more power distribution connectors, thereby providing a communications channel between the power box and the one or more functional boxes. A plurality of power distribution connectors are coupled together to form a primary and/or secondary power distribution chain between the power box and the one or more functional boxes.

In a further exemplary embodiment, the present disclosure provides a stackable telecommunications equipment power distribution method, including: providing a rack structure; disposing a power box including one more power modules in the rack structure; disposing one more functional boxes in the rack structure adjacent to the power box; and providing one more power distribution connectors adapted to couple and distribute power between one or more of (a) the power box and an adjacent one of the one or more functional boxes and (b) adjacent functional boxes of the one or more functional boxes; wherein each of the one or more power distribution connectors includes a rigid but compliant power jumper segment including a first connector disposed at each end thereof adapted to engage the associated power box or functional box. The power jumper segment further includes one or more second connectors disposed at one or more ends thereof adapted to engage a first connector of another power jumper segment to form a linked chain of power jumper segments. The power jumper segment is formed with a bend along a length thereof, creating a spring section that permits the length of the power jumper segment to be adjusted to a degree via compression or extension thereof. The power distribution method further includes providing a connection detection mechanism adapted to detect the coupling of the first connector with or the disconnection of the first connector from the associated power box or functional box. The connection detection mechanism is further adapted to power up or power down the power box or functional box upon detecting the coupling of the first connector with or the disconnection of the first connector from the power box or functional box. The power distribution method further includes providing a modulation mechanism adapted to apply a modulation scheme to power distributed over the one or more power distribution connectors, thereby providing a communications channel between the power box and the one or more functional boxes.

BRIEF DESCRIPTION OF THE DRAWINGS

The present disclosure is illustrated and described herein with reference to the various drawings, in which like reference numbers are used to denote like assembly components/method steps, as appropriate, and in which.

DESCRIPTION OF EMBODIMENTS

Again, the solution of the present disclosure connects the power in parallel distribution chains. A horizontal pizza box in the middle of the equipment stack represents the power box (PB), which houses the power modules (PMs), such as the power input modules (PIMs) or the power supply units (PSUs). The PMs in the PB are connected to the office power source(s), and the PB supplies power to the parallel distribution chains (A' and B').

The parallel distribution chains are composed of jumper segments that are based on busbar-like technology, with each jumper being the length of the distance between coupled boxes, typically 1 RU, but potentially also longer. Any box can be removed without disrupting either distribution chain. Advantageously, the jumper segments are touch-proof, from a safety perspective. Thus, instead of a jumper created using a cable, PCB, or the like, or a jumper composed of a custom molded back-to-back connector, the jumpers are based on busbar-like technology.

Figure 1:
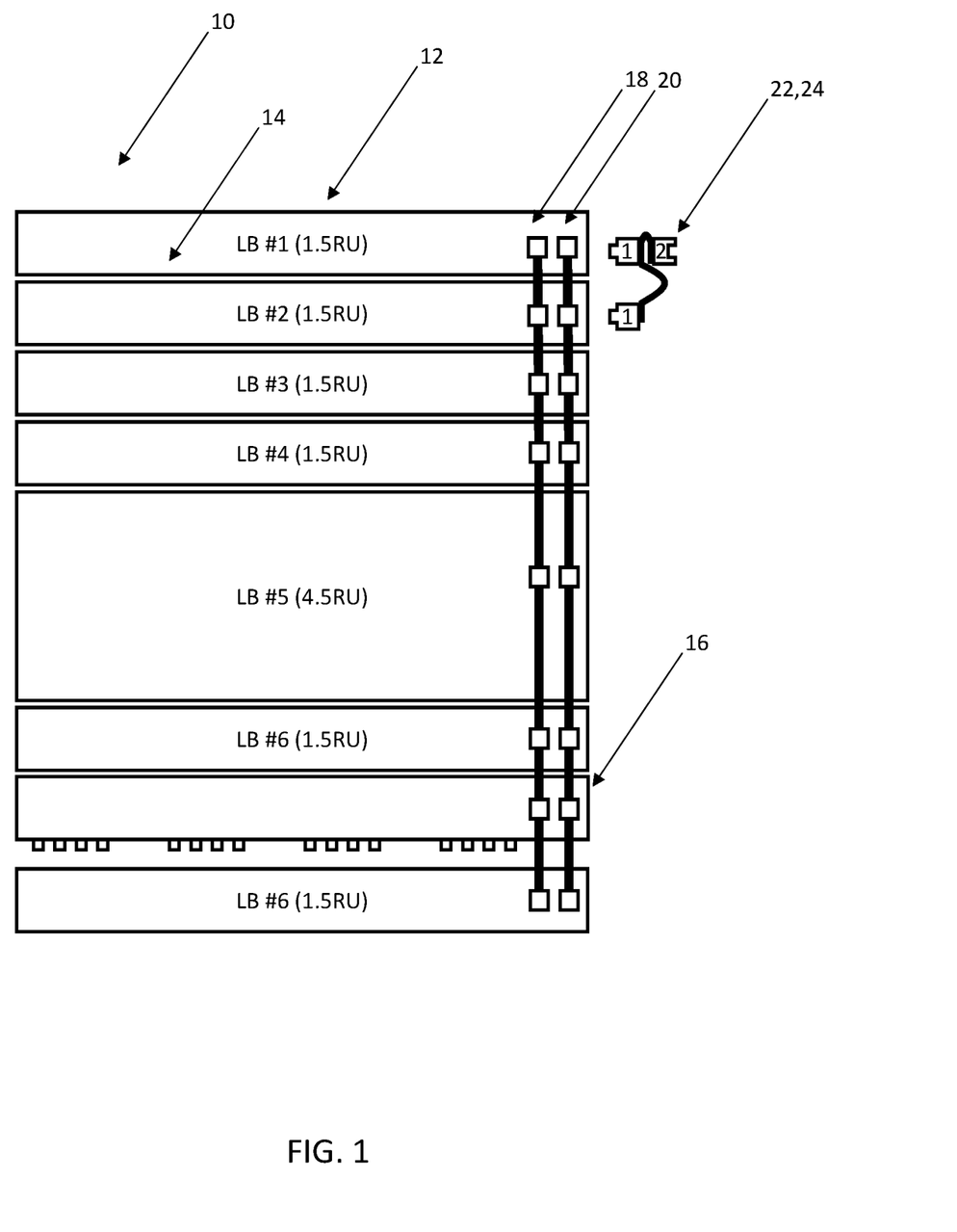
FIG. 1 is a schematic diagram illustrating one exemplary embodiment of the stackable power distribution assembly of the present disclosure, highlighting one exemplary embodiment of the power jumper connector utilized therewith.

Referring now specifically to FIG. 1, in one exemplary embodiment, a stack 10 of boxes 12 is provided. This stack 10 can, of course, be assembled in any suitable support structure (not illustrated). As illustrated, the majority of the boxes 12 are 1.5 RU in height, while one of the boxes 12 is 4.5 RU in height, although the boxes 12 can each be of any desired height. When stacked, each of the boxes 12 is separated by a small gap 14, on the order of 1 mm, for facilitating installation and removal of the boxes 12 into and from the stack 10. As illustrated, at least one of the boxes 12 is a PB 16 that houses the PMs (not illustrated). In operation, it is important that power is effectively distributed to this PB 16 to the rest of the boxes 12, and that any of the boxes 12 can essentially be hot swapped from a power standpoint. As illustrated, redundant, parallel power distribution chains, A' 18 and B' 20, are provided for this purpose. As used herein, "parallel" does not necessarily denote a physical arrangement, but rather a functional one, implying operational "redundancy." Power distribution chains A' 18 and B' 20 are coupled to all or (in a zone configuration) select ones of the boxes 12, as is described in greater detail herein below. In this manner, multiple of the boxes 12 are essentially daisy-chained together, and to the PB 16.

Figure 2:
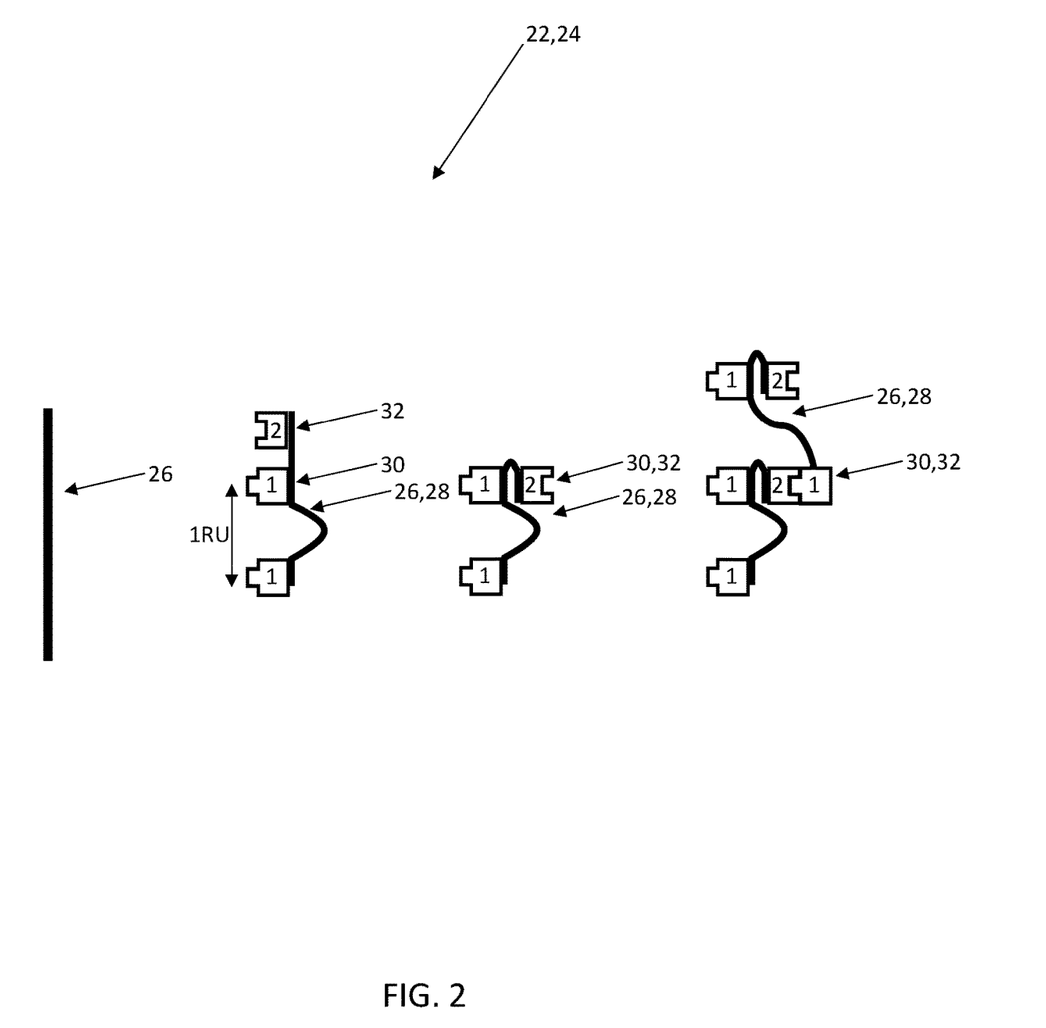
FIG. 2 is a series of schematic diagrams illustrating one exemplary embodiment of the method for assembling the power jumper connector of FIG. 1, as well as the one exemplary embodiment of the associated distribution chain.

Referring now specifically to FIGS. 1 and 2, in one exemplary embodiment, each of the connectors 22 between directly or indirectly adjacent boxes 12 includes a jumper segment 24 that is composed of a power jumper segment 26 that is flexible enough to be adjusted slightly in length, but rigid enough to resist deformation to a degree and retain its shape. This power jumper segment 26 may consist of a flexible laminated power jumper material or the like. To enhance this adjustability, a bend 28 is provided in the power jumper segment 26 that causes the power jumper segment 26 to act as a gap-spanning spring member. First connectors 30 are welded, bonded, or otherwise affixed or coupled to opposed end portions of the power jumper segment 26. These first connectors 30 are adapted to make electrical contact with corresponding connectors associated with the adjacent boxes 12. One or more second connectors 32 are also welded, bonded, or otherwise affixed or coupled to one or more end portions the power jumper segment 26 opposite one or more of the first connector 30. These second connectors 32 are adapted to make electrical contact with a first connector 30 of another jumper segment 24, as is illustrated. Optionally, a second connector 32 is attached to one end portion of the power jumper segment 26 next to a first connector 30. This end portion of the power jumper segment 26 is then bent 180 degrees such that the second connector 32 and the first connector 30 are disposed in a back-to-back, opposed configuration. It will be readily apparent to those of ordinary skill in the art that the jumper segments 24 and associated connectors 30,32 can be assembled and arranged in any manner such that they may be electrically coupled together, and ultimately electrically coupled to the PB 16. Thus, boxes 12 and associated electrical connections can be added to and removed from the stack 10 in a modular fashion. This provides a simple, clean, small-footprint solution that avoids the mess of entangled daisy-chained cables and the complexity of custom power bridges, for example. A color-coded convention can optionally be used, such as yellow "female" for the power source receptacle and blue "male" for the load plug, for example. It should be noted that parallel chains of connected or independent jumper segments 24 are utilized to form the parallel power distribution chains A' 18 and B' 20.

A key feature of the jumper segment 24 is the utilization a latching mechanism that is separate and distinct from the action of connecting/disconnecting the connection from a load (i.e., box) input connector safely. The latching mechanism is detected by the box 12 and used to power down the box 12 before the physical un-mating, which eliminates arcing issues.

One method of accomplishing this is to use two screws to hold the jumper segment 24 in the mated position. These screws are detected by sensors in the box 12 (e.g., Hall-effect sensors, infrared (IR) sensors, mechanical switch sensors, etc.). To power-up the box 12, power must be applied and at least one "cable mated" screw must be detected. However, to power-down the box 12, both "cable mated" screws must be undetected. This mechanism is tolerant to a single sensor failure without accidentally shutting down a working system. The fact that the screws used for the "cable mated" detection require a tool is advantageous for meeting safety requirements, since it requires a very intentional action to remove them. Two screws simply represent an exemplary embodiment of the more generic method. Other methods involve a single screw that holds a detectable arm or the like, detectable squeeze triggers that are part of the connector, etc. All have the key attribute of requiring a two-step operation.

Another method to prevent disconnect arcing is to have an early-disconnect signal wire that cascades through the jumper segments 24. This signal could be used by all the downstream boxes 12 to shut off their power. This would also work with the A' 18 and B' 20 chains, as a box 12 could divert power from one chain and switch to the other chain in the event of a disconnect. An advantage of arc elimination is that it is thereby unnecessary shut down A' or B' distribution in order to expand/replace a system. Optionally, the latching mechanism for a given second connector 32 can be used to hold both the second connector 32 and an associated first connector 30 in place.

Another method of preventing arcing is to distribute a pulsed trapezoidal DC power waveform or the like. For example, 90% of cycle at 52V and 5% of cycle at 0V and 5% for transitions . . . this waveform at a 1 kHz frequency, for example. When the connector latch is popped (as per any of the methods above), this would cause the box 12 to wait for the 0V part of the cycle to disconnect. Since there is no current flowing during this 5% of the cycle, there is no arcing.

Advantageously, because jumper segments 24 are used, removing a box 12 from the rack 10 in the middle of the chain (A' 18 or B' 20) does not disrupt power to the rest of the chain (A' 18 or B' 20). Preferably, the jumper segments 24 utilize mechanical keying so that one cannot insert an A' jumper segment 24 into a B' port or vice versa. Similarly, mechanical keying can be used with 380V and 48V or jumpers of different current capacities.

For the most compact solution, a single chain can be completed by a long jumper segment 24 that connects both ends of the chain, thus forming a ring that effectively acts as "redundant power distribution." During normal operation, current flows thru both sides of the ring. Thus, no boxes 12 lose power if only one jumper segment 24 is disconnected. This also helps with mitigating arcing, since arcing is minimized when one jumper segment 24 is disconnected because excess current simply flows around the other side of the ring. Only the self-inductance (100-1000 nH) of the jumper segment 24 itself can cause a little arcing, but this is minimal energy even with hundreds of amps.

A consideration with long power distribution chains is that the current can be very high on the first few jumper segments 24, since a chain might be supplying power to many loads 12 (e.g., 1500 W to each of ten boxes 12 would be over 300 A at 48 VDC). Flexible braided power jumper (1.19" dual-layer braid) can handle 380A and is still sufficiently flexible, but high currents can be problematic for other reasons. A solution to this is to move to 380 VDC distribution, which is already making headway as a standard in some datacenters. Alternatively, 240 VDC could be used, which is being used in some applications in China. Another option is to subdivide larger chains into zones to reduce current per chain.

Figure 3:
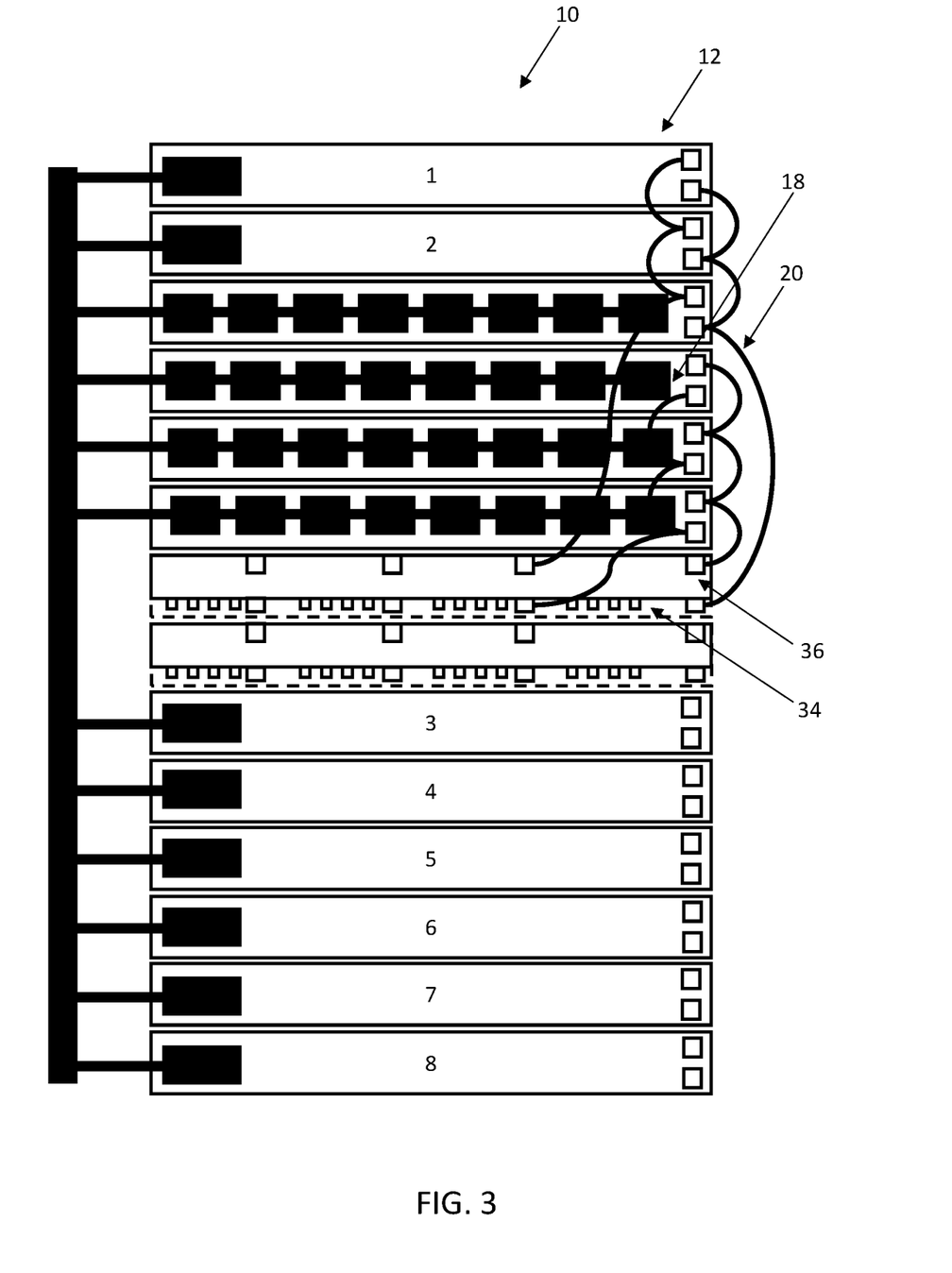
FIG. 3 is a schematic diagram illustrating one exemplary embodiment of the stackable power distribution assembly of the present disclosure divided into a plurality of zones.

Referring now specifically to FIG. 3, to support N+1 power supply redundancy, each PB 34 is equipped with N+1 PMs 36. Each PM diode 36 ORs current onto both an A' and B' solid power jumper internal to the PB 34. In the example illustrated, each PB 34 in the center of the stack 10 is equipped with four PMs 36 and there can be up to four chains drawing from the A' power jumper and another four chains drawing from the B' power jumper (only two A' chains 18 and two B' chains 20 are shown for clarity). A chain can thus have a secondary function, which is to connect A' of one PB 34 to A' of another PB 34. Likewise, B' of one PB 34 can be chained to B' of another PB 34. With 4×PM per PB 34, this example allows for 7+1 redundancy (or any required N+M redundancy, where M is greater than 1 and N+M is less than 8). Depending on desired redundancy requirements, 1+1, 3+1, or 7+1 are possible, or additional PBs 34 can be added to support configurations like 11+1 redundancy.

Figure 4:
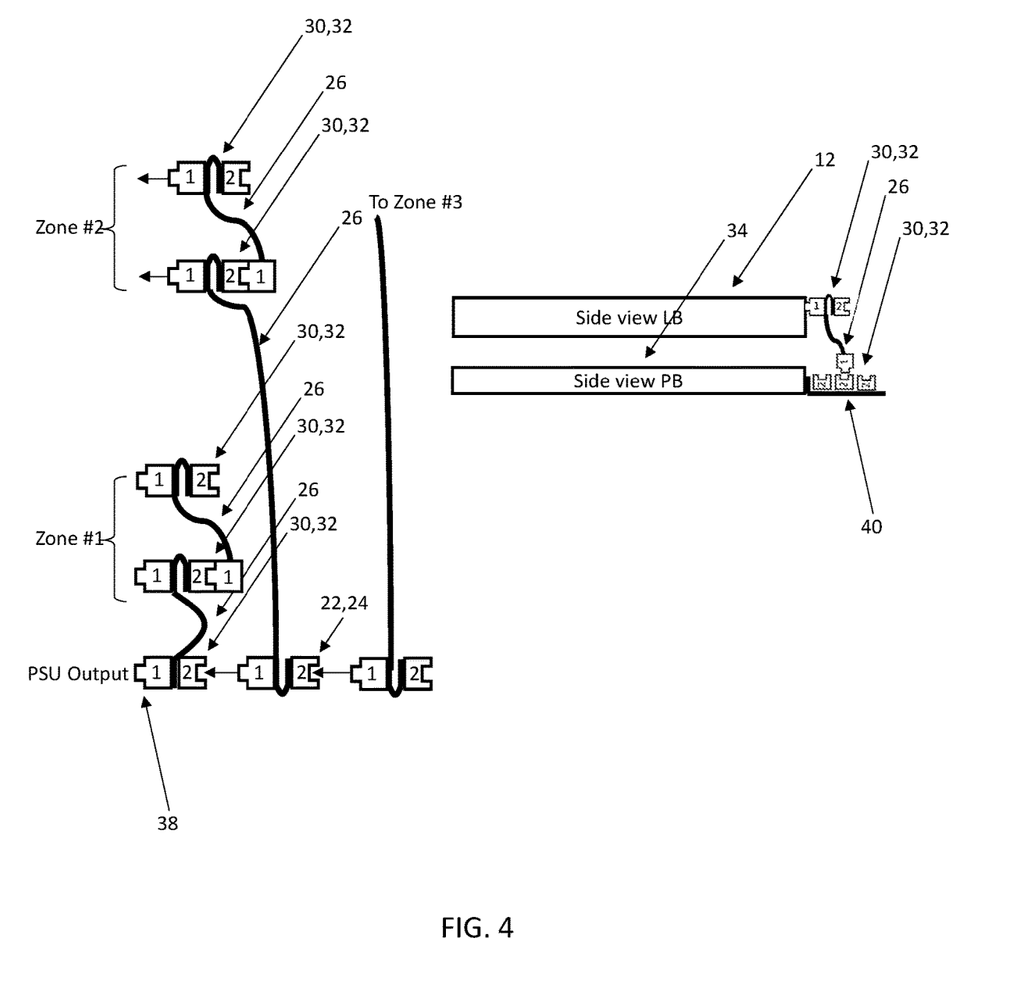
FIG. 4 is a schematic diagram illustrating another exemplary embodiment of the stackable power distribution assembly of the present disclosure divided into a plurality of zones.

Referring now specifically to FIG. 4, zones may be created in a number of other ways as well, in a cascaded manner. As illustrated, a first power jumper segment 26 can be coupled between a PB 34 and a first box 12 associated with a first zone via a pair of first connectors 30. The first box 12 can then be coupled to a second box 12 also associated with the first zone via a second power jumper segment 26, another pair of first connectors 30, and a second connector 32 that couples the first power jumper segment 26 to the second power jumper segment 26, for example. Likewise, a first power jumper segment 26 can be coupled between a PB 34 and a first box 12 associated with a second zone via a pair of first connectors 30. The first box 12 can then be coupled to a second box 12 also associated with the second zone via a second power jumper segment 26, another pair of first connectors 30, and a second connector 32 that couples the first power jumper segment 26 to the second power jumper segment 26, for example. Likewise, a first power jumper segment 26 can be coupled between a PB 34 and a first box 12 associated with a third zone via a pair of first connectors 30. The first box 12 can then be coupled to a second box 12 also associated with the third zone via a second power jumper segment 26, another pair of first connectors 30, and a second connector 32 that couples the first power jumper segment 26 to the second power jumper segment 26, for example. As illustrated, the initial jumper connections 22 for each zone can be stacked connector-to-connector on a single PB output port 38, or they can be coupled to a common PB output power jumper 40 in parallel.

An advantage of the solution provided herein is that it lends itself well to a manufactured pre-assembled and pre-configured system. Since the power cabling described herein can fit within the box footprint, it enables the sliding of a pre-configured product into a rack. A further advantage of the solution is that it is frame-independent. There is no need to use upright space, and likely no power cable management system is required. The flexible PB configuration also supports the possibility of a chain of one load per chain, which is equivalent to point-to-point cabling for applications that might not favor multiple loads per chain. Jumper chains can be stacked on top of each other to increase current-carrying capacity of an operational system.

A broadcast communications channel can be implemented over the DC power chain wiring itself using a modulation scheme. The method of doing this widely known, however the application here is novel. This allows one to automate load assignment (per chain) and report detailed load correlation back to the power boxes. It enables a capacity calculator per chain, which allows the management system to determine if there is power capacity to add another box, for example. A key use of this channel is for the open-circuit detection of the power chain. The communications channel could be used to detect if A' and B' chains are crossed since each chain would broadcast a different code. Consequent actions could be applied based on this collision detection. The communications channel can be one-way, and the return communications can be via standard management channels that do not flow over power wiring. Power modules within the power box can provide voltage and current isolation between the office input feeds and the A' and B' distributions to the boxes. This guarantees a balanced current draw on the input feeds, which is an important characteristic for customers. Otherwise, unbalanced feeds can result, as well as the subsequent cascading of breaker trips. The concepts presented herein apply equally to battery boxes that store power while the power boxes are active and donate power when voltage drops are experienced.

Thus, the present disclosure provides a compact cabling and connector solution that leaves space for data signaling and control connectors, as well as associated airflow space and space for removable fans and the like. Reliability and redundancy comparable to that of a backplane is provided, and cable and connector handling and voltage concerns are addressed. Arcing is avoided, as each module typically requires 1500 W of power. It is also important to provide a pay-as-you-grow system that does not require the pre-allocation of space, as provided herein. A variety of module heights are accommodated (e.g., 1 RU, 1.5 RU, 2 RU, 3 RU, and 4 RU) in one stack, without the need for complex cable slack management and storage systems that could result in a mess of wiring. Further, the solution addresses the needs of multiple customers by offering options for 1:1 (AB) redundancy, N+1 redundancy, AC/DC power options, and different office feed voltages and amperage ratings, as well as meeting other needs. Finally, spacing tolerances between modules and the considerations associated with EIA rack units and ETSI 25 mm vertical spacing requirements are accommodated. Circuit packs that fit into a chassis-based system have accurate alignment guides, but other line cards mount directly to a rack during initial installation, expansion upgrades, and replacements, when required.

Although the present disclosure is illustrated and described herein with reference to preferred embodiments and specific examples thereof, it will be readily apparent to those of ordinary skill in the art that other embodiments and examples can perform similar functions and/or achieve like results. All such equivalent embodiments and examples are within the spirit and scope of the present disclosure, are contemplated thereby, and are intended to be covered by the following non-limiting claims for all purposes.

What is claimed is:

1. A stackable telecommunications equipment power distribution assembly, comprising:
   a rack structure;
   a power box comprising one or more power modules disposed in the rack structure;
   one or more functional boxes disposed in the rack structure adjacent to the power box; and
   one or more power distribution connectors adapted to couple and distribute power between one or more of (a) the power box and an adjacent one of the one or more functional boxes and (b) adjacent functional boxes of the one or more functional boxes;
   wherein each of the one or more power distribution connectors comprises a rigid but compliant power jumper segment comprising a first connector disposed at each end thereof adapted to engage the associated power box or functional box.

2. The power distribution assembly of claim 1, wherein the power jumper segment further comprises one or more second connectors disposed at one or more ends thereof adapted to engage a first connector of another power jumper segment to form a linked chain of power jumper segments.

3. The power distribution assembly of claim 1, wherein the power jumper segment is formed with a bend along a length thereof, creating a spring section that permits the length of the power jumper segment to be adjusted to a degree via compression or extension thereof.

4. The power distribution assembly of claim 1, wherein each of the one or more power distribution connectors further comprises a connection detection mechanism adapted to detect the coupling of the first connector with or the disconnection of the first connector from the associated power box or functional box.

5. The power distribution assembly of claim 4, wherein the connection detection mechanism is further adapted to power up or power down the power box or functional box upon detecting the coupling of the first connector with or the disconnection of the first connector from the power box or functional box.

6. The power distribution assembly of claim 1, further comprising a modulation mechanism adapted to apply a modulation scheme to power distributed over the one or more power distribution connectors, thereby providing a communications channel between the power box and the one or more functional boxes.

7. The power distribution assembly of claim 1, wherein the one or more power distribution connectors are coupled together to form a primary power distribution chain between the power box and the one or more functional boxes.

8. The power distribution assembly of claim 1, wherein the one or more power distribution connectors are coupled together to form a secondary power distribution chain between the power box and the one or more functional boxes.

9. A stackable telecommunications equipment power distribution connector adapted to couple and distribute power between one or more of (a) a power box and an adjacent one of one or more functional boxes and (b) adjacent functional boxes of the one or more functional boxes, comprising:
a rigid but compliant power jumper segment;
a first connector disposed at each end of the power jumper segment adapted to engage the associated power box or functional box; and
one or more second connectors disposed at one or more ends of the power jumper segment adapted to engage a first connector of another power jumper segment to form a linked chain of power jumper segments.

10. The power distribution connector of claim 9, wherein the power jumper segment is formed with a bend along a length thereof, creating a spring section that permits the length of the power jumper segment to be adjusted to a degree via compression or extension thereof.

11. The power distribution connector of claim 9, further comprising a connection detection mechanism adapted to detect the coupling of the first connector with or the disconnection of the first connector from the associated power box or functional box.

12. The power distribution connector of claim 11, wherein the connection detection mechanism is further adapted to power up or power down the power box or functional box upon detecting the coupling of the first connector with or the disconnection of the first connector from the power box or functional box.

13. The power distribution connector of claim 9, further comprising a modulation mechanism adapted to apply a modulation scheme to power distributed over the one or more power distribution connectors, thereby providing a communications channel between the power box and the one or more functional boxes.

14. The power distribution connector of claim 9, wherein a plurality of power distribution connectors are coupled together to form a primary power distribution chain between the power box and the one or more functional boxes.

15. The power distribution connector of claim 9, wherein a plurality of power distribution connectors are coupled together to form a secondary power distribution chain between the power box and the one or more functional boxes.

16. A stackable telecommunications equipment power distribution method, comprising:
providing a rack structure;
disposing a power box comprising one or more power modules in the rack structure;
disposing one or more functional boxes in the rack structure adjacent to the power box; and
providing one or more power distribution connectors adapted to couple and distribute power between one or more of (a) the power box and an adjacent one of the one or more functional boxes and (b) adjacent functional boxes of the one or more functional boxes;
wherein each of the one or more power distribution connectors comprises a rigid but compliant power jumper segment comprising a first connector disposed at each end thereof adapted to engage the associated power box or functional box.

17. The power distribution method of claim 16, wherein the power jumper segment further comprises one or more second connectors disposed at one or more ends thereof adapted to engage a first connector of another power jumper segment to form a linked chain of power jumper segments.

18. The power distribution method of claim 16, wherein the power jumper segment is formed with a bend along a length thereof, creating a spring section that permits the length of the power jumper segment to be adjusted to a degree via compression or extension thereof.

19. The power distribution method of claim 16, further comprising providing a connection detection mechanism adapted to detect the coupling of the first connector with or the disconnection of the first connector from the associated power box or functional box.

20. The power distribution method of claim 16, further comprising providing a modulation mechanism adapted to apply a modulation scheme to power distributed over the one or more power distribution connectors, thereby providing a communications channel between the power box and the one or more functional boxes.

* * * * *